(12) United States Patent
Zhu et al.

(10) Patent No.: US 10,607,887 B2
(45) Date of Patent: Mar. 31, 2020

(54) METHOD FOR FORMING THREE-DIMENSIONAL INTEGRATED WIRING STRUCTURE AND SEMICONDUCTOR STRUCTURE THEREOF

(71) Applicant: Yangtze Memory Technologies Co., Ltd., Wuhan, Hubei (CN)

(72) Inventors: Jifeng Zhu, Hubei (CN); Jun Chen, Hubei (CN); Si Ping Hu, Hubei (CN); Zhenyu Lu, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,252

(22) Filed: Jul. 26, 2018

(65) Prior Publication Data
US 2019/0067106 A1 Feb. 28, 2019

Related U.S. Application Data

(63) Continuation of application No. PCT/CN2018/087102, filed on May 16, 2018.

(30) Foreign Application Priority Data

Aug. 31, 2017 (CN) .......................... 2017 1 0775893

(51) Int. Cl.
*H01L 29/40* (2006.01)
*H01L 21/768* (2006.01)
(Continued)

(52) U.S. Cl.
CPC .. *H01L 21/76898* (2013.01); *H01L 21/76224* (2013.01); *H01L 23/481* (2013.01);
(Continued)

(58) Field of Classification Search
None
See application file for complete search history.

(56) References Cited

U.S. PATENT DOCUMENTS 8,791,575 B2 7/2014 Oganesian et al.
9,219,032 B2 12/2015 Ramachandran et al.
(Continued)

FOREIGN PATENT DOCUMENTS

CN 102347283 A 2/2012
CN 104347364 A 2/2015
(Continued)

OTHER PUBLICATIONS

International Search Report and Written Opinion of the International Searching Authority directed to related international Patent Application No. PCT/CN2018/090457, dated Sep. 18, 2018; 7 pages.

(Continued)

*Primary Examiner* — Calvin Y Choi
(74) *Attorney, Agent, or Firm* — Sterne, Kessler, Goldstein & Fox P.L.L.C.

(57) ABSTRACT

Embodiments of methods and structures for forming a 3D integrated wiring structure are disclosed. The method can include forming a dielectric layer in a contact hole region at a front side of a first substrate; forming a semiconductor structure at the front side of the first substrate and the semiconductor structure having a first conductive contact, forming a recess at a backside of the first substrate to expose at least a portion of the dielectric layer; and forming a second conductive layer above the exposed dielectric layer to connect the first conductive contact. The 3D integrated wiring structure can include a first substrate having a contact hole region; a dielectric layer disposed in the contact hole region; a semiconductor structure formed at the front side of the first substrate, having a first conductive contact; a recess
(Continued)

formed at the backside of the first substrate to expose at least a portion of the dielectric layer; and a second conductive layer above the exposed dielectric layer.

20 Claims, 8 Drawing Sheets

(51) Int. Cl.
*H01L 21/762* (2006.01)
*H01L 25/18* (2006.01)
*H01L 23/48* (2006.01)
*H01L 23/522* (2006.01)
*H01L 27/105* (2006.01)

(52) U.S. Cl.
CPC .......... *H01L 23/5226* (2013.01); *H01L 25/18* (2013.01); *H01L 27/1052* (2013.01)

(56) References Cited

U.S. PATENT DOCUMENTS

| | | |
|---|---|---|
| 2006/0003578 A1* | 1/2006 | Lee .................. H01L 21/76816 438/638 |
| 2006/0223301 A1 | 10/2006 | Vanhaelemeersch et al. |
| 2008/0272358 A1 | 11/2008 | Lin et al. |
| 2009/0008747 A1 | 1/2009 | Hoshino et al. |
| 2011/0089572 A1 | 4/2011 | Tezcan et al. |
| 2011/0095373 A1 | 4/2011 | Hwang et al. |
| 2012/0258589 A1 | 10/2012 | Volant et al. |
| 2012/0306084 A1 | 12/2012 | Wood et al. |
| 2014/0008757 A1* | 1/2014 | Ramachandran ........................... H01L 23/49827 257/506 |
| 2014/0061750 A1 | 3/2014 | Kwon et al. |
| 2015/0035168 A1 | 2/2015 | Tezcan et al. |
| 2015/0206936 A1 | 7/2015 | Huang |
| 2016/0141294 A1 | 5/2016 | Peri et al. |
| 2016/0163734 A1 | 6/2016 | Kim et al. |
| 2017/0110464 A1* | 4/2017 | Rabkin ................ H01L 27/1157 |
| 2017/0207158 A1 | 7/2017 | Kang et al. |
| 2017/0236836 A1 | 8/2017 | Huo et al. |
| 2017/0323898 A1 | 11/2017 | Oh et al. |
| 2017/0365515 A1 | 12/2017 | Chin-Cheng et al. |
| 2019/0013326 A1 | 1/2019 | Hua et al. |
| 2019/0067105 A1 | 2/2019 | Zhu et al. |

FOREIGN PATENT DOCUMENTS

| | | |
|---|---|---|
| CN | 104428887 A | 3/2015 |
| CN | 104810396 A | 7/2015 |
| CN | 105097817 A | 11/2015 |
| CN | 106876401 A | 6/2017 |
| CN | 106992162 A | 7/2017 |
| CN | 107644837 A | 1/2018 |
| CN | 107644838 A | 1/2018 |
| WO | WO-2018/041890 A1 | 3/2019 |
| WO | WO-2019/041956 A1 | 3/2019 |

OTHER PUBLICATIONS

International Search Report and Written Opinion of the International Searching Authority directed to related International Patent Application No. PCT/CN2018/087102, dated Aug. 21, 2018; 7 pages.
International Search Report directed to related International Patent Application No. PCT/CN2018/102496, dated Dec. 3, 2018; 2 pages.
International Search Report directed to related International Patent Application No. PCT/CN2018/102504, dated Dec. 11, 2018; 2 pages.
Chinese Office Action directed to related Chinese Patent Application No. PCT/CN2018/087102 with attached English-language translation, dated Oct. 14, 2019; 22 pages.

* cited by examiner

METHOD FOR FORMING THREE-DIMENSIONAL INTEGRATED WIRING STRUCTURE AND SEMICONDUCTOR STRUCTURE THEREOF

CROSS-REFERENCE TO RELATED APPLICATIONS

This application claims priority to Chinese Patent Application No. 201710775893.0 filed on Aug. 31, 2017 and PCT Application No. PCT/CN2018/087102 filed on May 16, 2018, the entire content of which is incorporated herein by reference.

BACKGROUND

Embodiments of the present disclosure relate to the field of semiconductor manufacturing technology, and in particular to method for forming a 3D integrated wiring structure (e.g., a memory structure.)

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of methods for forming a 3D integrated wiring structure and semiconductor structures thereof are disclosed herein.

Disclosed is a method for forming a 3D integrated wiring structure, including: forming a dielectric layer in a contact hole region at a front side of a first substrate; forming a semiconductor structure at the front side of the first substrate, forming a recess at a backside of the first substrate to expose at least a portion of the dielectric layer; and forming a second conductive layer above the exposed dielectric layer to connect a first conductive contact. In some embodiments, forming the semiconductor structure at the front side of the first substrate includes forming a semiconductor device layer, a first conductive layer at a front side of the semiconductor device layer, and the first conductive contact. In some embodiments, a first end of the first conductive contact connects to the first conductive layer and a second end of the first conductive contact extends vertically through at least a portion of the semiconductor device layer.

In some embodiments, a backside of the dielectric layer is between the front side and the backside of the first substrate, and a front side of the dielectric layer is at a same height as the front side of the first substrate with respect to the backside of the first substrate.

In some embodiments, a backside of the dielectric layer is between the front side and the backside of the first substrate, and a front side of the dielectric layer is higher than the front side of the first substrate with respect to the backside of the first substrate.

In some embodiments, a backside of the dielectric layer is at a same height as the front side of the first substrate, and a front side of the dielectric layer is higher than the front side of the first substrate with respect to the backside of the first substrate.

In some embodiments, the second end of the first conductive contact is higher than the front side of the dielectric layer with respect to the backside of the first substrate.

In some embodiments, the second end of the first conductive contact is at a same height as the front side of the dielectric layer with respect to the backside of the first substrate.

In some embodiments, the second end of the first conductive contact is between the front side and the backside of the dielectric layer.

In some embodiments, forming the second conductive layer includes: forming an insulating layer covering the recess; forming a plurality of through holes extending vertically through the insulating layer and the backside of the dielectric layer connecting to the first conductive contact; disposing a first conductive material in the plurality of through holes; and disposing a second conductive material in the recess to form an electrical connection to the first conductive contact.

In some embodiments, forming the second conductive layer further includes removing at least a portion of the insulating layer above the first conductive contact prior to disposing the first conductive material in the plurality of through holes.

In some embodiments, the method further includes performing a thinning process to reduce thickness of the first substrate from the backside of the first substrate prior to forming the recess.

In some embodiments, the method further includes forming a conductive wiring layer on a backside of the second conductive layer. In some embodiments, the conductive wiring layer includes a wiring pattern electrically connecting to the second conductive layer.

In some embodiments, the method further includes bonding a second substrate with the semiconductor structure such that the semiconductor structure is sandwiched between the first substrate and the second substrate.

In some embodiments, bonding the second substrate with the semiconductor structure includes adhesive bonding, anodic bonding, direct wafer bonding, eutectic bonding, hybrid bonding, or a combination thereof.

In some embodiments, forming the first conductive layer, forming the first conductive contact, or forming the second conductive layer includes disposing copper, aluminum, tin, tungsten, or a combination thereof.

Another aspect of the present disclosure provides a structure, including: a first substrate, having a front side and a backside, and at least a portion of the front side has a contact hole region; a dielectric layer disposed in the contact hole region; a semiconductor structure formed at the front side of the first substrate, and the semiconductor structure includes a semiconductor device layer, a first conductive layer at a front side of the semiconductor device layer, and a first conductive contact, and a first end of the first conductive contact connects to the first conductive layer and a second end of the first conductive contact extends vertically through at least a portion of the semiconductor device layer; a recess formed at the backside of the first substrate to expose at least a portion of the dielectric layer; and a second conductive layer above the exposed dielectric layer.

In some embodiments, a backside of the dielectric layer is between the front side and the backside of the first substrate, and a front side of the dielectric layer is at a same height as the front side of the first substrate with respect to the backside of the first substrate.

In some embodiments, a backside of the dielectric layer is between the front side and the backside of the first substrate, and a front side of the dielectric layer is higher than the front side of the first substrate with respect to the backside of the first substrate.

In some embodiments, a backside of the dielectric layer is at a same height as the front side of the first substrate, and a front side of the dielectric layer is higher than the front side of the first substrate with respect to the backside of the first substrate.

In some embodiments, the second end of the first conductive contact is higher than the front side of the dielectric layer with respect to the backside of the first substrate.

In some embodiments, the second end of the first conductive contact is at a same height as the front side of the dielectric layer with respect to the backside of the first substrate.

In some embodiments, the second end of the first conductive contact is between the front side and the backside of the dielectric layer.

In some embodiments, the structure further includes an insulating layer covering the recess.

In some embodiments, the second conductive layer includes a first conductive material disposed in a plurality of through holes and a second conductive material disposed in the recess.

In some embodiments, the plurality of through holes extends vertically through the insulating layer and the backside of the dielectric layer connecting to the first conductive contact.

In some embodiments, the structure further includes a conductive wiring layer on a backside of the second conductive layer.

In some embodiments, the conductive wiring layer includes a wiring pattern electrically connecting to the second conductive layer.

In some embodiments, the structure further includes a second substrate bonded to the semiconductor structure such that the semiconductor structure is sandwiched between the first substrate and the second substrate.

In some embodiments, thickness of the dielectric layer is between about 0.3 μm and 5 μm.

In some embodiments, the semiconductor structure includes a plurality of 3D memory structures. In some embodiments, the plurality of 3D memory structures includes a memory device layer having a plurality of stacked memory cells.

In some embodiments, thickness of the plurality of 3D memory structures is between about 1 μm and 50 μm.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
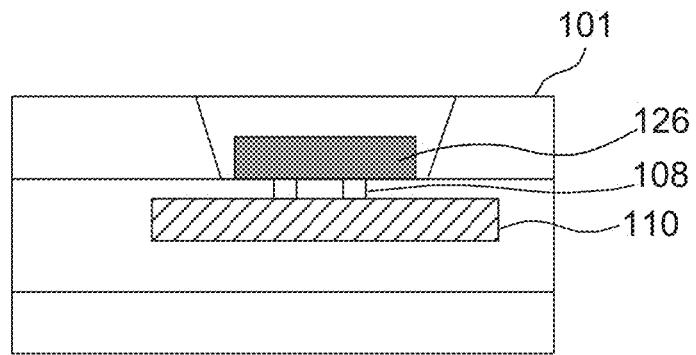
FIG. 1 illustrates a wiring method.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines).

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "vertical/vertically" means nominally perpendicular to a lateral surface of a substrate.

As used herein, the term "3D memory device" refers to a semiconductor device with vertically-oriented strings of memory cell transistors (referred to herein as "memory strings," such as NAND strings) on a laterally-oriented substrate so that the memory strings extend in the vertical direction with respect to the substrate.

Figure 2:
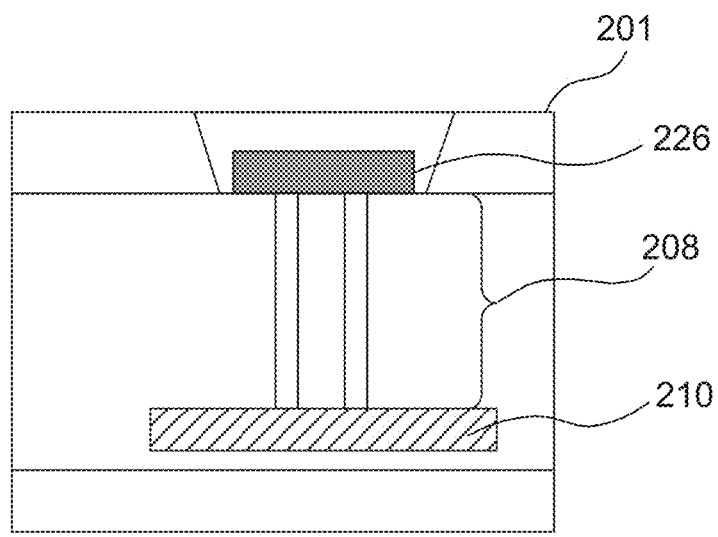
FIG. 2 illustrates a wiring method for forming a 3D semiconductor structure.

As shown in FIG. 1, a wafer wiring technology includes etching directly from the backside of wafer 101, exposing first metal layer ($M_1$) 110 and forming an electrical connection between a conductive wiring layer 126 and first metal layer 110 through vias 108. As shown in FIG. 2, in a 3D memory technology, the memory cell is fabricated perpendicularly to the wafer surface. A thick semiconductor device layer 208 is formed, with a thickness up to about 5 microns (μm), between conductive wiring layer 226 and first metal layer 210. But this arrangement makes forming an electrical contact between conductive wiring layer 226 and first metal layer 210 challenging using the wiring technique as illustrated in FIG. 1.

Various embodiments in accordance with the present disclosure provide a method for forming a 3D integrated wiring structure and a semiconductor device with an interconnect structure. The method for forming a 3D integrated wiring structure disclosed herein can include: forming a dielectric layer in a contact hole region at a front side of a first substrate, forming a semiconductor structure at the front side of the first substrate; forming a recess at a backside of the first substrate to expose at least a portion of the dielectric layer, and forming a second conductive layer above the exposed dielectric layer. The semiconductor structure can include a semiconductor device layer, a first conductive layer at a front side of the semiconductor device layer, and a first conductive contact electrically connected to the first and the second conductive layer. As a result, the method for forming a 3D integrated wiring structure disclosed herein can provide an interconnect structure and enable wiring through a thick semiconductor device layer to streamline fabrication process, reduce production cost and improve device quality.

Figure 3:
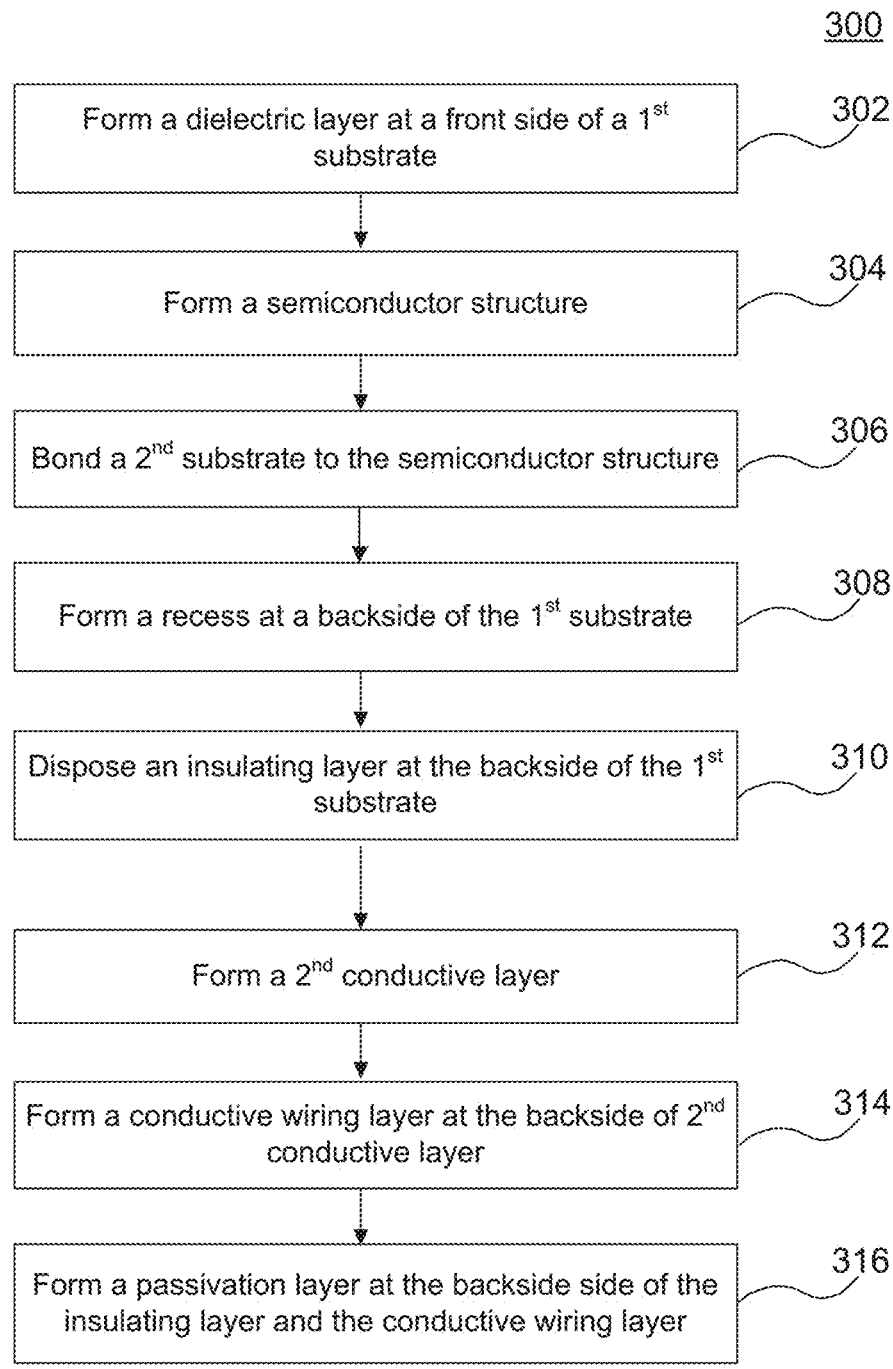
FIG. 3 is a flowchart of an exemplary wiring method for forming a 3D integrated wiring structure, according to some embodiments of the present disclosure.

FIG. 3 is a flowchart of an exemplary integrated wiring method 300 for forming a 3D memory device, according to some embodiments of the present disclosure. FIGS. 4-11 illustrate an exemplary fabrication method to form a 3D memory device, according to some embodiments of the present disclosure. It should be understood that the steps shown in method 300 and the fabrication method shown in FIGS. 4-11 are not exhaustive and that other methods and steps can be performed as well before, after, or between any of the illustrated methods and steps.

Referring to FIG. 3 and FIGS. 4A-4C, method 300 starts at step 302, in which dielectric layer 404 is formed at front side 403 of first substrate 402. As used herein, the term "front side" of a structure refers to the side of the structure at which a device is formed. Conversely, as used herein, the term "backside" refers to the side of the structure that is opposite to the front side. For ease of illustration, first substrate 402 is shown upside down such that backside 401 of first substrate 402 is above front side 403.

The materials of first substrate 402 can be silicon, germanium, a III-V semiconductor, silicon carbide, or silicon on insulating substrate, or a combination thereof. In some embodiments, first substrate 402 can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof.

In some embodiments, first substrate 402 is a silicon wafer. First substrate 402 can include one or more contact hole regions 412. A contact hole region defines where first conductive contacts (e.g., contact holes) can be formed in further steps as described below. Dielectric layer 404 is formed in contact hole region 412.

In some embodiments, the material for dielectric layer 404 can include oxides, nitrides or a combination thereof. The fabrication method to form dielectric layer 404 includes, but not limited to, lithography, etching, deposition, filling, polishing, or a combination thereof.

In some embodiments, the fabrication method to form dielectric layer 404 includes forming a shallow trench in contact hole region 412 of front side 403 of first substrate 402 through a lithography and etching process, depositing and filling the shallow trench with a dielectric material, and optionally planarizing the dielectric layer thought polishing.

Figure 4A:
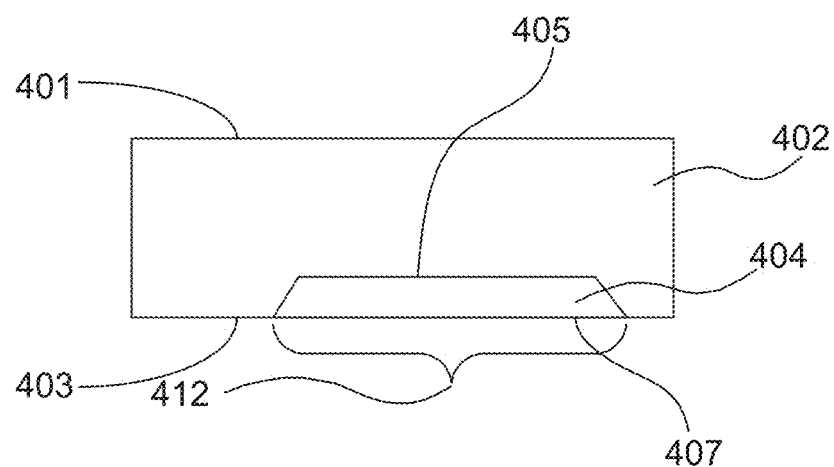
FIGS. 4A-4C and 5-11 illustrate an exemplary fabrication process for forming a 3D integrated wiring structure, according to some embodiments of the present disclosure.

In some embodiments, a backside 405 of dielectric layer 404 is located between front side 403 and backside 401 of first substrate 402, and front side 407 of dielectric layer 404 is at the same height as front side 403 of first substrate 402 with respect to backside 401 of first substrate 402, as shown in FIG. 4A.

Figure 4B:
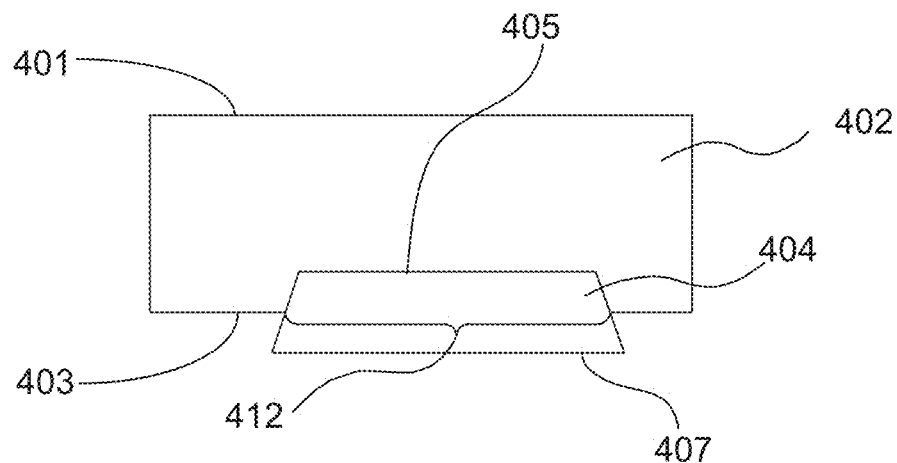

In some embodiments, backside 405 of dielectric layer 404 is located between front side 403 and backside 401 of first substrate 402, and front side 407 of dielectric layer 404 is higher than front side 403 of first substrate 402 with respect to backside 401 of first substrate 402, as shown in FIG. 4B.

In some embodiments, the fabrication method to form dielectric layer 404 includes depositing dielectric layer 404 at front side 403 of first substrate 402, and optionally planarizing the dielectric layer thought polishing.

Figure 4C:
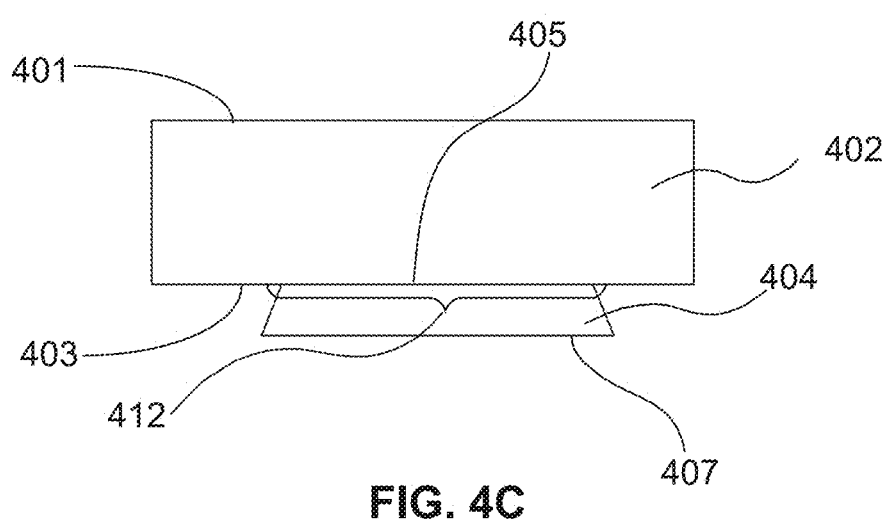

In some embodiments, backside 405 of dielectric layer 404 is at the same height as front side 403 of first substrate 402, and front side 407 of dielectric layer 404 is higher than front side 403 of first substrate 402, both with respect to backside 401 of first substrate 402, as shown in FIG. 4C.

In some embodiments, the thickness of the dielectric layer is between about 0.3 μm and 5 μm. In some embodiments, the thickness of the dielectric layer is about 1 μm. The thickness of the dielectric layer is optimized to facilitate subsequent process of forming interconnected structures.

An exemplary fabricated method to form dielectric layer 404 as shown in FIGS. 4A and 4B is disclosed as follows. First, a hard mask layer is deposited on front side 403 of first substrate 402 (e.g., silicon wafer), followed by a sequential etch of the hard mask layer and first substrate 402 to form a shallow trench. The hard mask layer can include a silicon nitride layer formed by a chemical vapor deposition process, a silicon oxide layer formed by a High Density Plasma Chemical Vapor Deposition (HDPCVD) process or a combination thereof. The hard mask layer and first substrate 402 can be etched to form trenches using any well-known techniques recognized by those skilled in the art. Second, a dielectric layer is filled in the shallow trench and on the hard mask layer using HDPCVD or any well-known techniques recognized by those skilled in the art. Dielectric layer 404 material can include, but not limited to, oxides, nitrides, oxynitrides, a combination thereof, or the like. In some embodiments, dielectric layer 404 material can include silicon oxide, silicon nitride, silicon oxynitride, or a combination thereof. Third, the dielectric layer on the hard mask layer is removed by a chemical mechanical polishing (CMP) method or any well-known techniques recognized by those skilled in the art to fully expose the surface of the hard mask layer. Fourth, a rapid thermal oxidation method is performed at an ambient temperature of 400 to 800° C. In some embodiments, the ambient temperature at the shallow trench during rapid thermal oxidation method is 500700° C. In some embodiments, the ambient temperature at the shallow trench is linearly heated to 400-800° C. within 60-140 seconds during rapid thermal oxidation process. In some embodiments, the ambient temperature at the shallow trench can be, for example, 450° C., 480° C., 550° C., 600° C., 660° C., 640° C., and 750° C. The linear heating time can be 70 seconds, 75 seconds, 80 seconds, 95 seconds, 103 seconds, 115 seconds, 125 seconds, 130 seconds.

In some embodiments, the rapid thermal oxidation method can include a step to introduce an oxygen-containing gas into the environment where the trench is located. The oxygen-containing gas can include oxygen ($O_2$), ozone ($O_3$), or any other gas that has oxidizing ability. While not being bound by any particular theory or mechanism, it is believed that this step can eliminate damage to the atomic structure at the corners of the trench caused by the prior fabrication processes and prevent further damage to the atomic structure at the corners of the trench in subsequent processes.

In the rapid thermal oxidation process, the dielectric layer in the trench is in a high-temperature oxygen environment, the concentration and molecular activity of oxygen molecules in the high-temperature environment is high. The original molecular structure is relatively loose at the corner of the trench, so the free silicon ions generated during the CMP process can be fully oxidized in this process. And the newly oxidized oxides and the original oxide molecules in the dielectric layer in the trenches can form a stable molecular bond at the high temperature. The loose oxides structure at the corners of the dielectric layer in the trenches becomes firm and dense, therefore, repairing damage to the atomic structure at the corner of the trench caused by the prior fabrication processes. This high temperature oxidation process can be referred to as high temperature quenching. Lastly, the hard mask layer is removed by wet etching or any well-known techniques recognized by those skilled in the art. The choices of chemical etching agent vary depending on the materials of the hard mask layer, and is a technique known to those skilled in the art.

Figure 5:
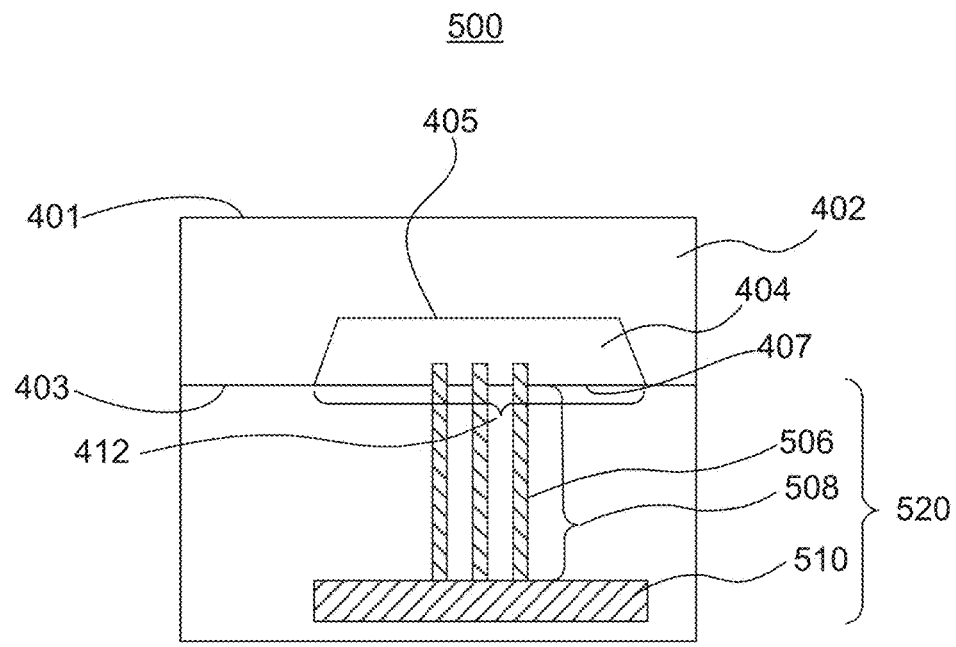

Referring to FIG. 3 and FIG. 5, method 300 proceeds to step 304, in which semiconductor structure 520 is formed. As illustrated in FIG. 5, semiconductor structure 520 is formed at front side 403 of first substrate 402. Semiconductor structure 520 can include a semiconductor device layer 508 at front side 403 of first substrate 402, and first conductive layer 510 ($M_1$) at the front side of semiconductor device layer 508. A plurality of first conductive contacts 506 (contact holes, through array contacts (TACs) or contact vias) are formed within semiconductor device layer 508, and a first end of first conductive contact 506 connects to first conductive layer 510 and a second end of the first conductive contact 506 extends vertically through at least a portion of semiconductor device layer 508. However, first conductive contact 506 can also be arranged in other ways which is illustrated in details in the following part. In some embodiments, the entire part of dielectric layer 404 is in first substrate 402 and an interface between dielectric layer 404 and semiconductor structure 520 is at the same height as front side 403 of first substrate 402 with respect to backside 401 of first substrate 402. In some embodiments, a part of dielectric layer 404 is in first substrate 402, the other part of dielectric layer 404 is in semiconductor structure 520, an interface between dielectric layer 404 and semiconductor structure 520 is higher than front side 403 of first substrate 402 with respect to backside 401 of first substrate 402. In some embodiments, the entire part of dielectric layer 404 is in semiconductor structure 520 and an interface between dielectric layer 404 and first substrate 402 is at the same height as front side 403 of first substrate 402 with respect to backside 401 of first substrate 402. As used herein, the term "front side" of a structure refers to the side of the structure at which a device is formed. Conversely, as used herein, the term "backside" refers to the side of the structure that is opposite to the front side.

For ease of illustration, structures 500-1100 are shown upside down in FIGS. 5-11 such that the backside of structures 500-1100 is above the front side. However, it is understood that in practice, structure 500 can be flipped such that backside 401 of first substrate 402 becomes the bottom surface of the structure 500 during the fabrication process. In some embodiments, the thickness of the first substrate is between about 0.5 μm and 20 μm. In some embodiments, the thickness of the first substrate is between about 1 μm and 5 μm.

In some embodiments, semiconductor structure 520 is a 3D memory structure. In some embodiments, semiconductor device layer 508 can include a memory stack. In some embodiments, the memory stack is formed by repeatedly stacking a plurality of memory cells. In some embodiments, the thickness of semiconductor device layer 508 is between about 1 μm and 50 μm. In some embodiments, the thickness of semiconductor device layer 508 is between about 5 μm and 50 μm. In some embodiments, the thickness of semiconductor device layer 508 is greater than 5 μm. In some embodiments, memory array stack is formed by multiple fabrication methods, including, but not limited to, thin film deposition of dielectric layers, etching of channel holes and slits, thin film deposition of memory films in the channel holes, and gate and word line replacement. In some embodiments, memory array stack can be formed (e.g., disposed) at front side 403 of first substrate 402 and can include an alternating conductor/dielectric stack and an array of NAND strings extending through the alternating conductor/dielectric stack. The alternating conductor/dielectric stack can include alternating conductor layers (e.g., metal layers or polysilicon layers) and dielectric layers (e.g., silicon oxide layers or silicon nitride layers). Each NAND string can include a plurality of vertically-stacked memory cells each controlled by a respective conductor layer (functioning as a control gate) of the alternating conductor/dielectric stack that surrounds the NAND string. The conductor layers in the alternating conductor/dielectric stack can extend in the lateral direction outside the memory array region (e.g., also referred to as the core region) to thereby form word lines of semiconductor structure 520 (e.g., memory array structure). Each NAND string can also include a drain at an end (e.g., at the front side of semiconductor structure 520). The drain of each NAND string can be electrically connected to a respective one of a plurality of bit lines of semiconductor structure 520. In some embodiments, each NAND string further includes multiple select gates (e.g., a source select gate and a drain select gate). Some structures described in this paragraph are not shown in FIG. 5 as they would be appreciated by a person skilled in the pertinent art.

Semiconductor structure 520 can include one or more first conductive contacts 506 (contact holes, TACs, or contact vias) each extending vertically through at least part of semiconductor structure 520. In some embodiments, first conductive contacts 506 can extend vertically through the entire thickness of the structure 500, i.e., between the two nominally parallel surfaces at the front side and backside of the structure 500. For example, first conductive contact 506 can pass through the entire thickness of semiconductor device layer 508 and the entire thickness of first substrate 402. In some embodiments, first conductive contact 506 can extend vertically through part of the entire thickness of the structure 500. In some embodiments, first conductive contact 506 can pass through the entire thickness of semiconductor device layer 508 and part of the entire thickness of dielectric layer 404. In some embodiments, first conductive contact 506 can pass through the entire thickness of semiconductor device layer 508 and the entire thickness of dielectric layer 404 so that first conductive contact 506 reach backside 405 of dielectric layer 404. In some embodiments, first conductive contact 506 can pass through the entire thickness of semiconductor device layer 508 and part of the entire thickness of first substrate 402. In some embodiments, first conductive contact 506 can pass through part of the entire thickness of semiconductor device layer 508 without reaching to first substrate 402. In some embodiments, first conductive contact 506 is in contact with dielectric layer 404 at one end, and in contact with first conductive layer 510 at the other end.

In some embodiments, a first end of the first conductive contact 506 connects to first conductive layer 510 and a second end of the first conductive contact 506 extends vertically through at least a portion of the semiconductor device layer 508. In some embodiments, the second end of first conductive contact 506 is higher than front side 407 of dielectric layer 404 with respect to backside 401 of first substrate 402. In some embodiments, the second end of first conductive contact 506 is at a same height as front side 407 of dielectric layer 404 with respect to backside 401 of first substrate 402. In some embodiments, the second end of first conductive contact 506 is between front side 407 and backside 405 of dielectric layer 404.

Each first conductive contact (e.g., contact hole) 506 can include a vertical opening filled with conductor materials, including, but not limited to, tungsten (W), cobalt (Co), copper (Cu), aluminum (Al), doped silicon, silicides, or a combination thereof.

In some embodiments, the diameter of the first conductive contacts (e.g., contact holes) is between about 0.3 μm and 5 μm. In some embodiments, the diameter of the contact holes is between about 0.5 μm and 1 μm.

First conductive contact 506 can be in the memory array region and/or outside the memory array region, for example, in a staircase region of semiconductor structure 520. First conductive contact 506 can form electrical connection with word line contacts, bit line contacts, and gate select contacts. The word line contacts can be in the staircase region and electrically connect to the word lines, such that each word line contact can individually address the corresponding word line. The bit line contacts can electrically connect to the NAND strings by the bit lines, such that each bit line contact can individually address the corresponding NAND string. The gate select contacts can electrically connect to the select gates. Some structures described in this paragraph are not shown in FIG. 5, as they would be appreciated by a person skilled in the pertinent art.

Semiconductor structure 520 can include first conductive layer 510 at the front side of semiconductor device layer 508. First conductive layer 510 can provide connection to the memory array structure and/or the peripheral device structure. First conductive layer 510 can be patterned based on the layout of the internal structure of memory array device and/or the peripheral device structure, so that suitable interconnect structures can be formed. First conductive layer 510 can include, but not limited to, W, Co, Cu, Al, metal silicides, or any other suitable materials.

Figure 6:
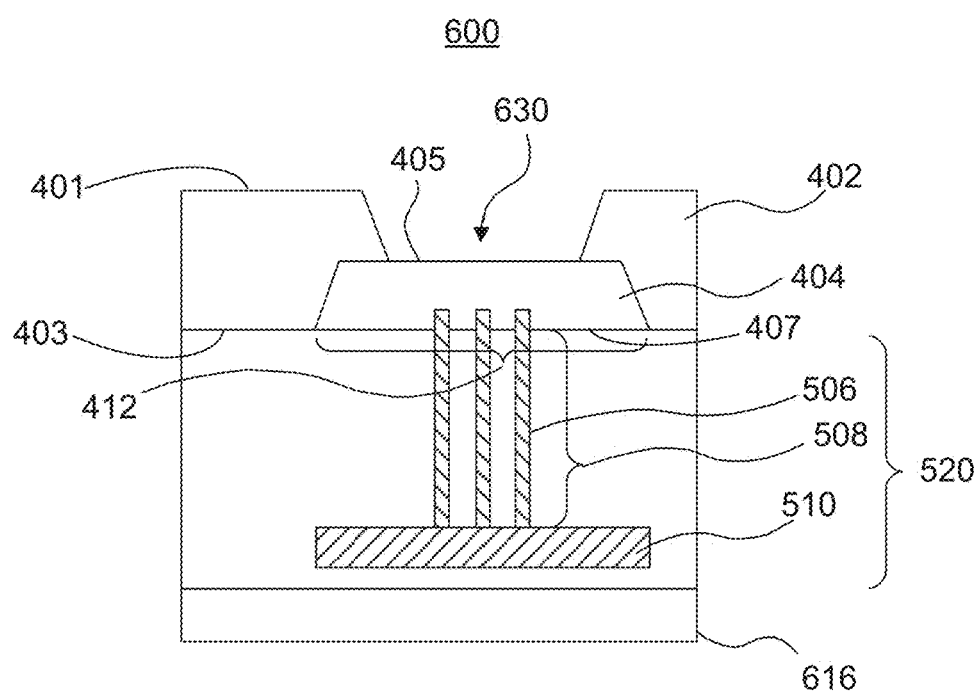

Referring to FIG. 3 and FIG. 6, method 300 proceeds to step 306 and 308, in which second substrate 616 can be bonded to semiconductor structure 520, followed by a formation of recess 630 at the backside of first substrate 402. As illustrated in FIG. 6, second substrate 616 can be bonded to semiconductor structure 520. In some embodiments, after bonding, the semiconductor structure 520 is sandwiched between first substrate 402 and second substrate 616. The bonding of the second substrate can include adhesive bonding, anodic bonding, direct wafer bonding, eutectic bonding, hybrid metal/dielectric bonding or a combination thereof. Adhesive bonding, also referred to as gluing or glue bonding, is a wafer bonding technique with applying an intermediate layer to connect substrates of different materials. Anodic bonding is a wafer bonding process to seal glass to either silicon or metal without introducing an intermediate layer, which is commonly used to seal glass to silicon wafers in electronics and microfluidics, through electric fields. Direct bonding, also referred to as fusion bonding, is a wafer bonding process without any additional intermediate layers. The direct bonding process is based on chemical bonds between two surfaces of material meeting specific requirements. The direct bonding process can include wafer pre-processing, pre-bonding at room temperature and annealing at elevated temperatures. Eutectic bonding, also referred to as eutectic soldering, is a wafer bonding technique with an intermediate metal layer that can produce a eutectic system. Hybrid bonding, also known as "metal/dielectric hybrid bonding", can be a direct bonding technology (e.g., forming bonding between surfaces without using intermediate layers, such as solder or adhesives), which obtains metal-metal bonding and dielectric-dielectric bonding simultaneously.

The materials of second substrate 616 can be silicon, germanium, a III-V semiconductor, silicon carbide, or silicon on insulating substrate, or a combination thereof. In some embodiments, second substrate 616 can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, second substrate 616 is silicon wafer.

In some embodiments, first substrate 402 is thinned from backside through techniques including, but not limited to, mechanical grinding (e.g., polishing), chemical mechanical planarization, wet etching and atmospheric downstream plasma dry chemical etching. The materials of first substrate 402 can be silicon, germanium, a III-V semiconductor, silicon carbide, or silicon on insulating substrate, or a combination thereof. In some embodiments, first substrate 402 is a silicon wafer.

In some embodiments, the thinning process reduces first substrate 402 (e.g., silicon wafer) thickness from an initial range about 400-700 µm down to a final range of about 200-250 µm. In some embodiments, the thinning process reduces first substrate 402 (e.g., silicon wafer) thickness from an initial range about 400-700 µm down to a final range of about 150-200 µm. In some embodiments, the thinning process reduces first substrate 402 (e.g., silicon wafer) thickness from an initial range about 400-700 µm range down to a final range of about 125-150 µm. In some embodiments, the thinning process reduces first substrate 402 (e.g., silicon wafer) thickness from an initial range about 400-700 µm range down to a final range of about 100-125 µm. In some embodiments, the thinning process reduces first substrate 402 (e.g., silicon wafer) thickness of an initial about 400-700 µm range down to a final range less than about 100 µm.

In some embodiments, recess 630 is formed at the backside of first substrate 402 through techniques including, but not limited to, mechanical grinding (e.g., polishing), chemical mechanical polishing (CMP), wet etching, atmospheric downstream plasma dry chemical etching, or any well-known techniques recognized by those skilled in the art.

An exemplary fabrication method to form recess 630 as shown in FIG. 6 is disclosed as follows. First, form a hard mask, for example silicon nitride, over a targeted region on the backside of substrate 402 and patterning a photoresist over the hard mask to define a recess feature. After patterning, etching is performed through the openings in the hard mask to create recesses in the target regions of the substrate. Then the hard mask layer is removed from the top of the substrate. When the hard mask is a nitride, for example, this is achieved by etching with hot phosphoric acid. After formation of recess 630, a top portion of dielectric layer 404 is exposed.

Figure 7:
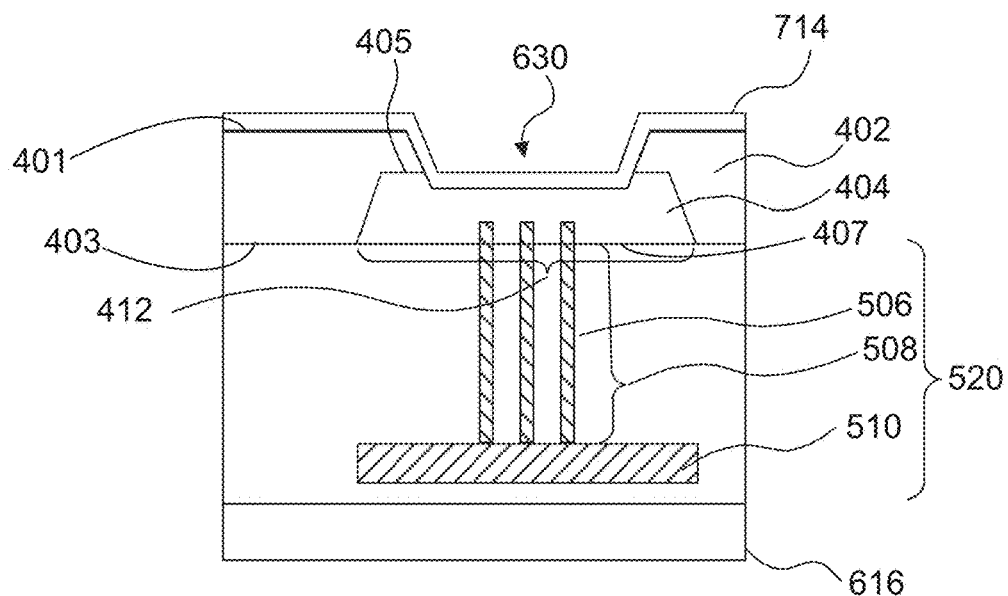

Referring to FIG. 3, method 300 proceeds to step 310, in which an insulating layer is disposed at the backside of the first substrate. As illustrated in FIG. 7, insulating layer 714 is disposed at backside 401 of first substrate 402. In some embodiments, insulating layer 714 covers the entire backside 401 of first substrate 402 and recess 630. In some embodiments, insulating layer 714 covers at least a portion of backside 401 of first substrate 402 and recess 630. In some embodiments, insulating layer 714 covers all sidewalls of recess 630 and the exposed backside 405 of dielectric layer 404.

The dielectric material of insulating layer 714 can include oxides, nitrides, oxynitrides, or a combination thereof. In some embodiments, insulating layer 714 includes silicon oxide, silicon nitride, silicon oxynitride, or a combination thereof. Insulating layer 714 can be formed by one or more thin film deposition processes, such as ALD, CVD, PVD, or a combination thereof.

In some embodiments, the thickness of the insulating layer is between about 0.1 µm and 10 µm. In some embodiments, the thickness of the insulating layer is between about 0.1 µm and 5 µm. In some embodiments, the thickness of the insulating layer is between about 0.5 µm and 1 µm.

Figure 8:
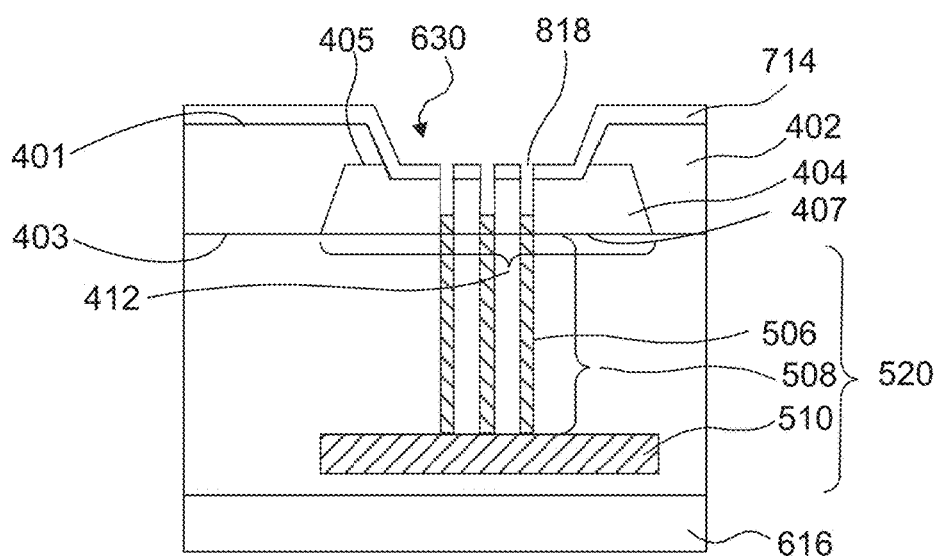
Figure 9:
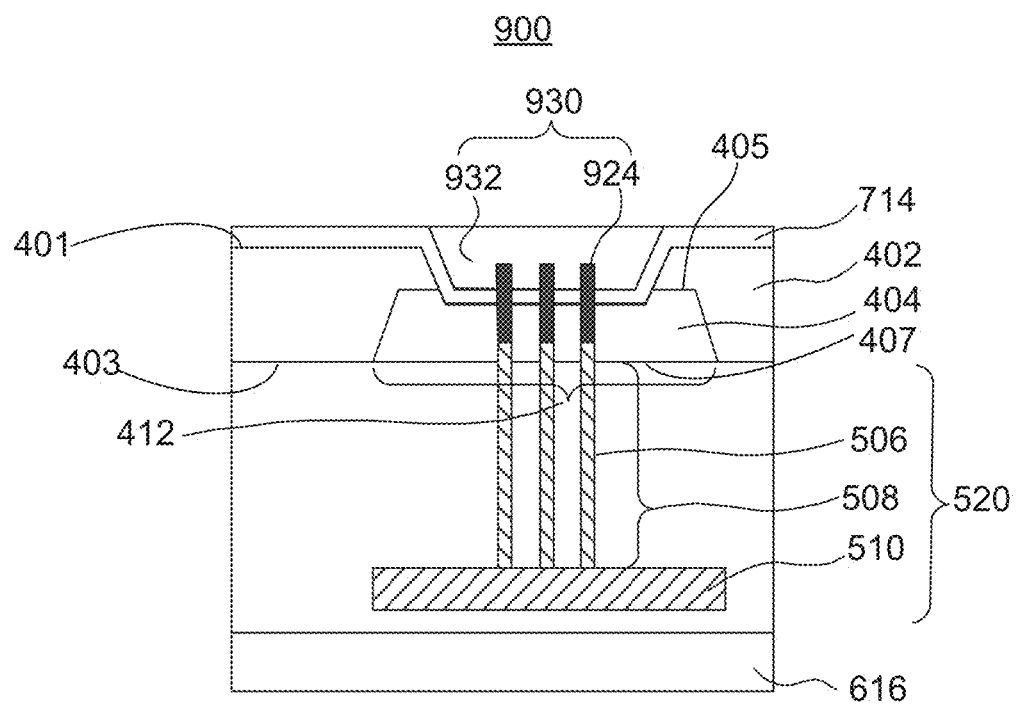

Referring to FIG. 3, FIG. 8, and FIG. 9, method 300 proceeds to step 312, in which a second conductive layer 930 is formed. Second conductive layer 930 can include first conductive material 924 (as shown in FIG. 9) disposed in a plurality of through holes 818 (as shown in FIG. 8), and second conductive material 932 (as shown in FIG. 9) disposed in recess 630 (as shown in FIG. 8). As illustrated in FIG. 8, through holes 818 is formed at backside 405 of dielectric layer 404, extending vertically through insulating layer 714 and backside of the dielectric layer 404 connecting to first conductive contact 506. In some embodiments, plurality of through holes 818 extends vertically and penetrates the entire thickness of insulating layer 714 and the entire thickness of dielectric layer 404. In some embodiments, plurality of through holes 818 extends vertically and penetrates the entire thickness of insulating layer 714 and at least a portion of dielectric layer 404. In some embodiments, plurality of through holes 818 can be connected with contact holes 506. In some embodiments, fabrication methods to form plurality of through holes 818 include forming a plurality of holes that extends vertically through insulating layer 714 and first substrate 402 through techniques including, but not limited to, lithography, etching, depositing an insulating layer or a combination thereof.

In some embodiments, a dielectric material can be deposited into the through holes to form an insulating liner (not shown). The dielectric material can include oxides, nitrides, oxynitrides, or a combination thereof. In some embodiments, the insulating liner comprises silicon oxide, silicon nitride, silicon oxynitride, or a combination thereof. The insulating liner can be formed by one or more thin film deposition methods, such as ALD, CVD, PVD, or a combination thereof.

Referring to FIG. 9, plurality of through holes 818 is filled with a first conductive material 924 using ALD, CVD, PVD, any other suitable methods, or a combination thereof. The first conductive material used for filling plurality of through holes 818 can include, but are not limited to, W, Co, Cu, Al, Sn, polysilicon, silicides, or a combination thereof. In some embodiments, the first conductive material used for filling plurality of through holes 818 can include, Cu, Al, Sn, W, or a combination thereof. In some embodiments, other conductive materials are also used to fill the openings to function as a barrier layer, an adhesion layer, and/or a seed layer. In some embodiments, at least a portion of insulating layer 714 is removed above first conductive contact 506 prior to disposing a first conductive material in a plurality of through holes 818.

In some embodiments, the diameter of the through holes is between about 0.3 µm and 5 µm. In some embodiments, the diameter of the through holes is between about 0.5 µm and 5 µm. In some embodiments, the diameter of the through holes is between about 0.3 µm and 1 µm. In some embodiments, the diameter of the through holes is between about 0.5 µm and 1 µm.

As illustrated in FIG. 8 and FIG. 9, second conductive material 932 (as shown in FIG. 9) is disposed in recess 630 (as shown in FIG. 8) to form an electrical connection to first conductive contact 506. Second conductive material 932 is deposited in recess 630 using ALD, CVD, PVD, any other suitable methods, or a combination thereof. Second conductive material 932 can include, but are not limited to, W, Co, Cu, Al, Sn, polysilicon, silicides, or a combination thereof. In some embodiments, second conductive material 932 can include, Cu, Al, Sn, W, or a combination thereof. In some embodiments, other conductor materials are also used to fill the recess to function as a barrier layer, an adhesion layer, and/or a seed layer.

Figure 10:
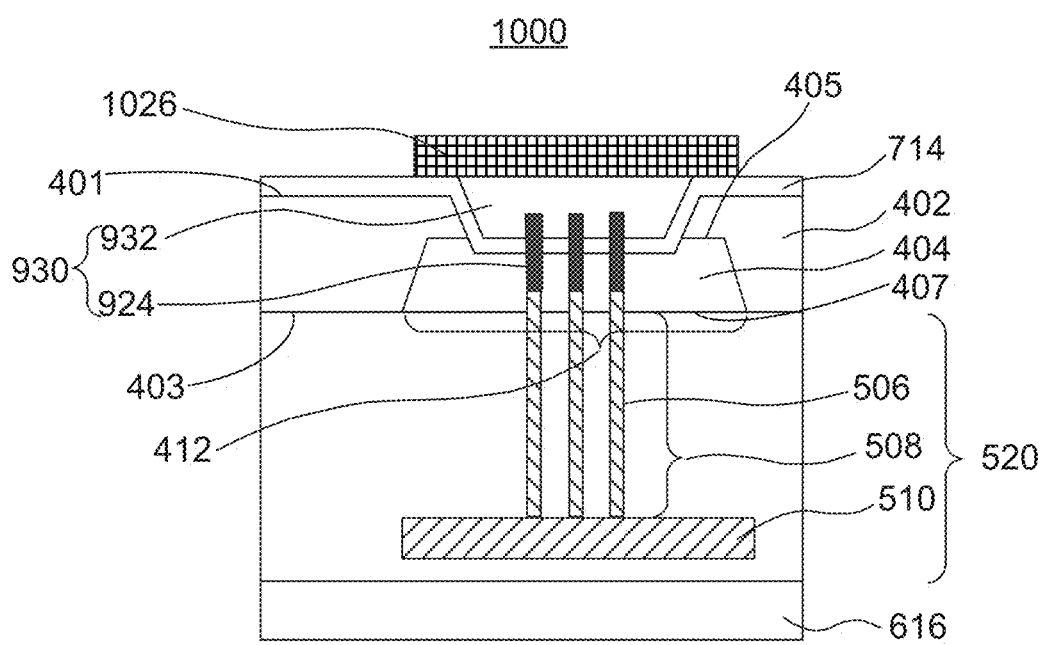

Referring to FIG. 3, method 300 proceeds to step 314, in which a conductive wiring layer is formed at the backside of the second conductive layer. As illustrated in FIG. 10, a conductive material is deposited at the backside of second conductive layer 930 and patterned through photolithography and etching to form conductive wiring layer 1026. Conductive wiring layer 1026 can form an electrical connection with first conductive materials 924 inside the through holes. In some embodiments, conductive wiring layer 1026 can form an electrical connection with semiconductor device layer 508, first conductive layer 510, and/or second substrate 616. Conductive wiring layer 1026 can be patterned based on the layout of the internal structure of memory array device and/or the peripheral device structure, so that suitable interconnect structures can be formed. Conductive wiring layer 1026 can include, but not limited to, W, Co, Cu, Al, Ag, Sn, metal silicides, or any other suitable materials. In some embodiments, conductive wiring layer 1026 can include Cu, Ag, Al, Sn, W, or a combination thereof. In some embodiments, conductive wiring layer 1026 is in or on one or more BEOL interconnect layers (not shown) at the backside of the structure 1000.

In some embodiments, to reduce stress caused by conductive wiring layer 1026, the distance in the vertical direction between conductive wiring layer 1026 and semiconductor device layer 508 is at least about 3 µm. For example, the combined thickness of first substrate 402, semiconductor structure 520 and the BEOL interconnect layers underneath conductive wiring layer 1026 can be at least about 3 µm. In some embodiments, the vertical distance between conductive wiring layer 1026 and semiconductor device layer 508 is between about 3 µm and 10 µm (e.g., about 3 µm, about 4 µm, about 5 µm, about 6 µm, about 7 µm, about 8 µm, about 9 µm, about 10 µm, in any range bounded on the lower end defined by any of these values, or in any range defined by any two of these values). In some embodiments, conductive wiring layer 1026 can completely overlap semiconductor structure 520. In some embodiments, conductive wiring layer 1026 can partially overlap semiconductor structure 520.

Figure 11:
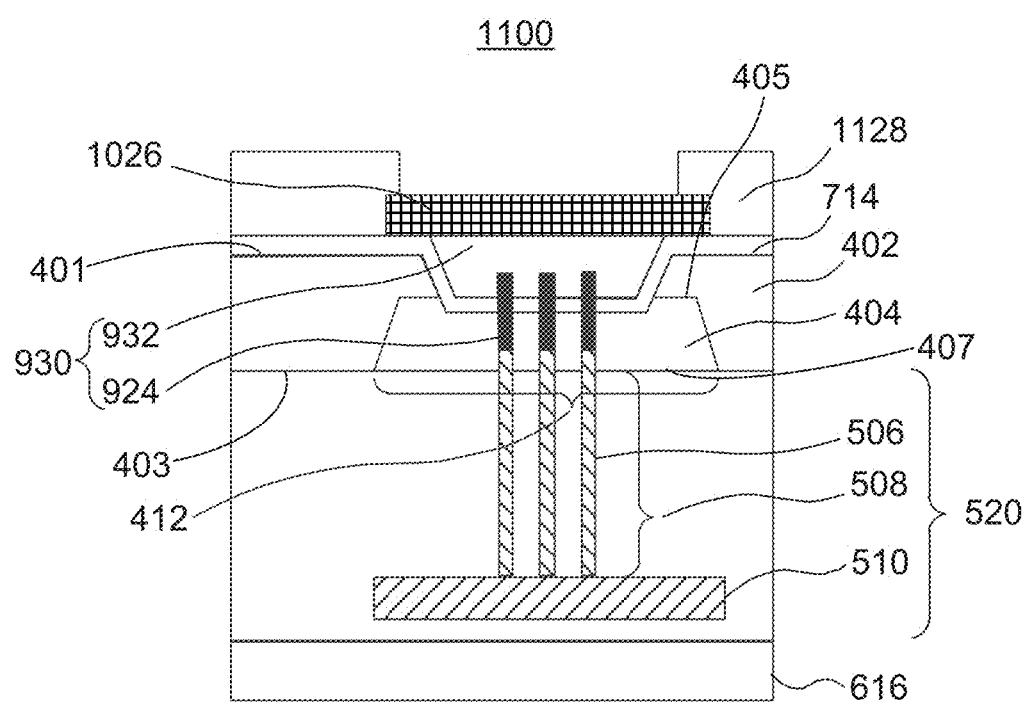

Referring to FIG. 3, method 300 proceeds to step 316, in which a passivation layer is formed on the backside side of the insulating layer and the conductive wiring layer. As illustrated in FIG. 11, passivation layer 1128 is deposited at the backside of semiconductor structure 520 over conductive wiring layer 1026 and insulating layer 714. Conversely, as used herein, the term "backside" refers to the side of the structure that is opposite to the front side. For example, a backside of an insulating layer is above the front side of an insulating layer in FIG. 11.

The dielectric material of passivation layer 1128 can include oxides, nitrides, oxynitrides, or a combination thereof. In some embodiments, passivation layer 1128 includes silicon oxide, silicon nitride, silicon oxynitride, or a combination thereof. Passivation layer 1128 can be formed by one or more thin film deposition methods, such as ALD, CVD, PVD, or a combination thereof. Passivation layer 1128 can be patterned based on the layout of the internal structure of memory array device and/or the peripheral device structure, so that suitable interconnect structures can be formed.

In some embodiments, the 3D memory device can further include a peripheral device structure (not shown) on second substrate 616, which are positioned face to face with their front sides facing towards the 3D memory structure. The peripheral device can include any suitable digital, analog, and/or mixed-signal peripheral circuits used for facilitating the step of 3D memory device. For example, the peripheral device can include one or more of a page buffer, a decoder (e.g., a row decoder and a column decoder), a driver, a charge pump, a current or voltage reference, or any active or passive components of the circuits (e.g., transistors, diodes, resistors, or capacitors). In some embodiments, the peripheral device is formed using CMOS technology.

In some embodiments, a 3D integrated wiring structure of a semiconductor device is provided, wherein the structure is made by the methods described in any one of the above embodiments. In some embodiments, the semiconductor device is a 3D memory device. In some embodiments, the 3D memory structure comprises a memory device layer having a plurality of contact holes, and a first metal layer. In some embodiments, the plurality of contact holes connects to the plurality of through holes at one end and connects to the first metal layer at the other end. In some embodiments, the 3D memory structures include a memory device layer having a plurality of stacked memory cells. In some embodiments, thickness of the 3D memory structures is between about 1 µm and 50 µm.

Various embodiments in accordance with the present disclosure provide a method for forming a 3D integrated wiring structure and a semiconductor device with an interconnect structure. The method for forming a 3D integrated wiring structure disclosed herein can include: forming a dielectric layer in a contact hole region at a front side of a first substrate, forming a semiconductor structure at the front side of the first substrate; forming a recess at a backside of the first substrate to expose at least a portion of the dielectric layer, and forming a second conductive layer above the exposed dielectric layer. The semiconductor structure can include a semiconductor device layer, a first conductive layer at a front side of the semiconductor device layer, and a first conductive contact electrically connected to the first and the second conductive layer. As a result, the method for forming a 3D integrated wiring structure disclosed herein can provide an interconnect structure and enable wiring through a thick semiconductor device layer.

In some embodiments, a method for forming a 3D integrated wiring structure is disclosed. A first substrate with at least a portion of the front side having a contact hole region is used. A dielectric layer is deposited in the contact hole region. A semiconductor structure including a semiconductor device layer, a first conductive layer at a front side of the semiconductor device layer, and a first conductive contact, is fabricated on the front side of the first substrate. The first conductive contacts connects to the first conductive layer at one end with the other end extending vertically through at least a portion of the semiconductor device layer. A recess is formed at the backside of the first substrate to expose a portion of the dielectric layer. A second conductive layer is formed above the exposed dielectric layer to connect the first conductive contact. In some embodiments, the 3D integrated wiring structure can include a 3D memory structure.

In some embodiments, a semiconductor structure with a 3D integrated wiring structure is disclosed. The semiconductor structure can include a first substrate, having a contact hole region on a front side of the first substrate; a dielectric layer disposed in the contact hole region; a semiconductor structure formed at a front side of the first substrate, a recess formed at a backside of the first substrate; and a second conductive layer above the dielectric layer. In some embodiments, the semiconductor structure can include a semiconductor device layer, a first conductive layer at a front side of the semiconductor device layer, and a first conductive contact with a first end connecting to the first conductive layer and a second end extending vertically through at least a portion of the semiconductor device layer.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a 3D integrated wiring structure, comprising:
    forming a dielectric layer in a contact hole region at a front side of a first substrate;
    forming a semiconductor structure at the front side of the first substrate, comprising forming a semiconductor device layer, a first conductive layer at a front side of the semiconductor device layer, and a first conductive contact, wherein a first end of the first conductive contact connects to the first conductive layer and a second end of the first conductive contact extends vertically through at least a portion of the dielectric layer;
    forming a recess at a backside of the first substrate to expose at least a portion of the dielectric layer; and
    forming a second conductive layer in the recess to connect to the first conductive contact, wherein an interface between the second conductive layer and the first conductive contact is inside the dielectric layer.

2. The method of claim 1, wherein forming the second conductive layer comprises:
    forming an insulating layer covering the recess;
    forming a plurality of through holes extending vertically through the insulating layer and the backside of the dielectric layer connecting to the first conductive contact;
    disposing a first conductive material in the plurality of through holes; and
    disposing a second conductive material in the recess to form an electrical connection to the first conductive contact.

3. The method of claim 2, wherein forming the second conductive layer further comprises removing at least a portion of the insulating layer above the first conductive contact prior to disposing the first conductive material in the plurality of through holes.

4. The method of claim 1, further comprising performing a thinning process to reduce thickness of the first substrate from the backside of the first substrate prior to forming the recess.

5. The method of claim 1, further comprising forming a conductive wiring layer on a backside of the second conductive layer, wherein the wring layer comprises a wiring pattern electrically connecting to the second conductive layer.

6. The method of claim 1, further comprising bonding a second substrate with the semiconductor structure such that the semiconductor structure is sandwiched between the first substrate and the second substrate.

7. The method of claim 6, wherein bonding the second substrate with the semiconductor structure comprises adhesive bonding, anodic bonding, direct wafer bonding, eutectic bonding, hybrid bonding, or a combination thereof.

8. The method of claim 1, wherein forming the first conductive layer, forming the first conductive contact, or forming the second conductive layer comprises disposing copper, aluminum, tin, tungsten, or a combination thereof.

9. A structure, comprising:
    a first substrate, having a front side and a backside, wherein at least a portion of the front side has a contact hole region;
    a dielectric layer disposed in the contact hole region;
    a semiconductor structure formed at the front side of the first substrate, wherein the semiconductor structure comprises a semiconductor device layer, a first conductive layer at a front side of the semiconductor device layer, and a first conductive contact, wherein a first end of the first conductive contact connects to the first conductive layer and a second end of the first conductive contact extends vertically through at least a portion of the dielectric layer;

a recess formed at the backside of the first substrate to expose at least a portion of the dielectric layer; and a second conductive layer formed in the recess, wherein the second conductive layer connects to the first conductive contact at an interface in the dielectric layer.

10. The structure of claim 9, further comprising an insulating layer covering the recess.

11. The structure of claim 10, wherein the second conductive layer comprises a first conductive material disposed in a plurality of through holes and a second conductive material disposed in the recess, wherein the plurality of through holes extending vertically through the insulating layer and the backside of the dielectric layer connecting to the first conductive contact.

12. The structure of claim 9, further comprising a conductive wiring layer on a backside of the second conductive layer, wherein the conductive wiring layer comprises a wiring pattern electrically connecting to the second conductive layer.

13. The structure of claim 9, further comprising a second substrate bonded to the semiconductor structure such that the semiconductor structure is sandwiched between the first substrate and the second substrate.

14. The structure of claim 9, wherein thickness of the dielectric layer is between about 0.3 µm and 5 µm.

15. The structure of claim 9, wherein the semiconductor structure comprises a plurality of 3D memory structures, wherein the plurality of 3D memory structures comprises a memory device layer having a plurality of stacked memory cells.

16. The structure of claim 15, wherein thickness of the plurality of 3D memory structures is between about 1 µm and 50 µm.

17. The method of claim 1, wherein forming the dielectric layer comprises forming the dielectric layer with a thickness larger than a depth of the contact hole region.

18. The method of claim 1, wherein forming the dielectric layer comprises forming the dielectric layer coplanar with a surface of the first substrate at the front side.

19. The structure of claim 9, wherein the dielectric layer comprises a thickness larger than a depth of the contact hole region.

20. The structure of claim 9, wherein the dielectric layer is coplanar with a surface of the first substrate at the front side.

\* \* \* \* \*